(12) United States Patent
Klebanoff

(10) Patent No.: US 6,169,652 B1
(45) Date of Patent: Jan. 2, 2001

(54) ELECTROSTATICALLY SCREENED, VOLTAGE-CONTROLLED ELECTROSTATIC CHUCK

(75) Inventor: Leonard Elliott Klebanoff, San Ramon, CA (US)

(73) Assignee: EUV, L.L.C., Livermore, CA (US)

( * ) Notice: Under 35 U.S.C. 154(b), the term of this patent shall be extended for 0 days.

(21) Appl. No.: 09/268,166

(22) Filed: Mar. 12, 1999

(51) Int. Cl.7 .................................................. H02N 13/00
(52) U.S. Cl. ............................................................ 361/234
(58) Field of Search ................................... 361/230–235; 279/128

(56) References Cited

U.S. PATENT DOCUMENTS

| | | |
|---|---|---|
| 5,221,403 | 6/1993 | Nozawa et al. . |
| 5,486,975 * | 1/1996 | Shamouilian et al. ............... 361/234 |
| 5,606,485 | 2/1997 | Shamouilian et al. . |
| 5,748,434 * | 5/1998 | Rossman et al. ..................... 361/234 |
| 5,815,366 * | 9/1998 | Morita et al. ......................... 361/234 |
| 5,822,171 | 10/1998 | Shamouilian et al. . |
| 5,835,333 | 11/1998 | Castro et al. . |
| 5,835,334 | 11/1998 | McMillin et al. . |
| 5,996,218 * | 12/1999 | Shamouilian et al. ................. 29/825 |

* cited by examiner

*Primary Examiner*—Michael J. Sherry
(74) *Attorney, Agent, or Firm*—Burns, Doane, Swecker & Mathis, L.L.P.

(57) ABSTRACT

Employing an electrostatically screened, voltage-controlled electrostatic chuck particularly suited for holding wafers and masks in sub-atmospheric operations will significantly reduce the likelihood of contaminant deposition on the substrates. The electrostatic chuck includes (1) an insulator block having a outer perimeter and a planar surface adapted to support the substrate and comprising at least one electrode (typically a pair of electrodes that are embedded in the insulator block), (2) a source of voltage that is connected to the at least one electrode, (3) a support base to which the insulator block is attached, and (4) a primary electrostatic shield ring member that is positioned around the outer perimeter of the insulator block. The electrostatic chuck permits control of the voltage of the lithographic substrate; in addition, it provides electrostatic shielding of the stray electric fields issuing from the sides of the electrostatic chuck. The shielding effectively prevents electric fields from wrapping around to the upper or front surface of the substrate, thereby eliminating electrostatic particle deposition.

24 Claims, 2 Drawing Sheets

ELECTROSTATICALLY SCREENED, VOLTAGE-CONTROLLED ELECTROSTATIC CHUCK

This invention was made with Government support under contract DE-AC04-94AL85000 awarded by the U.S. Department of Energy to Sandia Corporation. The Government has certain rights to the invention.

FIELD OF THE INVENTION

The invention relates to the design of electrostatic chucks that are particularly suited for use in projection lithography employing either soft x-rays or electrons and in particular for use in a lithographic system that includes a multi-chamber housing the reticle, optics, e.g., camera and condenser, and wafer.

BACKGROUND OF THE INVENTION

A number of different chucks are widely used to hold semiconductor wafers during processing. Mechanical chucks can secure the wafer by using arms or clamps to press the wafer against a supporting surface. The clamping force is inherently non-uniform, resulting in uneven stresses in the wafer which can cause deformation, and uneven thermal contact between the wafer and the support. Vacuum chucks secure the wafer by creating a vacuum beneath the wafer backside, thereby generating a clamping force due to the pressure differential between the processing chamber which is at higher pressure and the wafer backside. Vacuum chucks can provide a more uniform clamping force than can mechanical chucks, but in the low pressure environments required for many semiconductor processing applications, the pressure differential is insufficient to generate an adequate clamping force. For example, advanced lithography systems such as Extreme Ultraviolet Lithography (EUV) and Scattering with Angular Limitation Projection Electron Lithography (SCALPEL) operate at subatmospheric pressures.

With projection photolithography, a reticle (or mask) is imaged through a reduction-projection lens onto a wafer below. Reticles for EUV projection lithography typically comprise a silicon substrate coated with an EUV reflective material and an optical pattern fabricated from an EUV absorbing material that is formed on the reflective material. In operation, EUV radiation from the condenser is projected toward the surface of the reticle and radiation is reflected from those areas of the reticle reflective surface which are exposed, i.e., not covered by the x-ray absorbing material. The reflected radiation effectively transcribes the pattern from the reticle to the wafer positioned downstream from the reticle. A scanning exposure device uses simultaneous motion of the reticle and wafer (each mounted on its own X-Y stage platen) to continuously image a portion of the reticle onto the wafer through a projection optics. Scanning, as opposed to exposure of the entire reticle at once, allows for the projection of reticle patterns that exceed in size that of the image field of the projection lens. The stage platen includes mirrors that are mounted along its sides. Interferometer heads that direct laser beams onto the associated mirrors and detect the beam reflection therefrom are employed for position measurements.

Electrostatic chucks combine the advantages of the more uniform clamping ability of vacuum chucks and the usability in vacuum environments of mechanical chucks. In an electrostatic chuck (ESC), a voltage difference is applied between the wafer and a metallic electrode or pair of electrodes, the wafer and electrode(s) being separated by an interposed dielectric layer. The magnitude of the electrostatic clamping force thus generated depends on the applied voltage, the separation between the wafer and the electrode (s), and the dielectric constant of the interposed layer. As a result of their advantages over other chucking devices, ESCs have gained wide usage in the semiconductor processing industry.

Wafer and mask substrates used in semiconductor fabrication must be protected from particulate contamination. However, existing electrostatic chucks can produce sizable electric fields above the surface of the substrate which lead to electrostatic deposition of charged contaminant particles onto the substrate. These electric fields arise in the form of stray electric fields from the chuck electrodes, or results from the loss of electrical control of the substrate itself. Furthermore, the high voltages (e.g., 500 V or greater) produced in such chucks can cause electrical arcing from the leads and chuck electrodes to surrounding surfaces. Arcing can also contribute to contamination and substrate damage.

Aside from the quality of the optics that are employed in EUVL systems, factors that influence the quality of the printed wafers fabricated include the ability to prevent contamination of the substrate (i.e., mask and wafer) surfaces. Current electrostatic chucks used for gripping these lithographic components do not exclude electric field gradients and therefore do not prevent the associated electrostatic deposition of particles. Furthermore, existing chucks do not provide for voltage control of the lithographic component to prevent electric fields from developing between the lithographic component and a nearby structure that is at a different potential.

SUMMARY OF THE INVENTION

The present invention is directed to an electrostatically screened, voltage-controlled electrostatic chuck that will significantly reduce the likelihood of contaminant deposition on substrates during photolithography.

In one embodiment, the invention is directed to an electrostatic chuck for holding a substrate that includes:
- an insulator block having an outer perimeter and a planar surface adapted to support the substrate and comprising at least one electrode;
- a source of voltage that is connected to the at least one electrode;
- a support base to which the insulator block is attached; and
- a primary electrostatic shield ring member that is positioned around the outer perimeter of the insulator block.

In a preferred embodiment, (1) a pair of electrodes are embedded in the insulator block; (2) the primary electrostatic shield ring defines a planar surface that is flush with the planar surface of the insulator block; (3) the primary electrostatic shielding ring is grounded; and/or (4) the electrostatic chuck includes a secondary electrostatic shield ring positioned around and spaced apart from an outer surface of the primary electrostatic shield ring.

The electrostatic chuck permits control of the voltage of the lithographic substrate typically by grounding it; in addition, it provides electrostatic shielding of the stray electric fields issuing from the sides of the electrostatic chuck. The shielding effectively prevents electric fields from wrapping around to the upper or front surface of the substrate. By "upper or front surface" is meant the surface of the substrate which faces approaching radiation, e.g., EUV radiation.

DETAILED DESCRIPTION OF THE PREFERRED EMBODIMENTS

Figure 1:
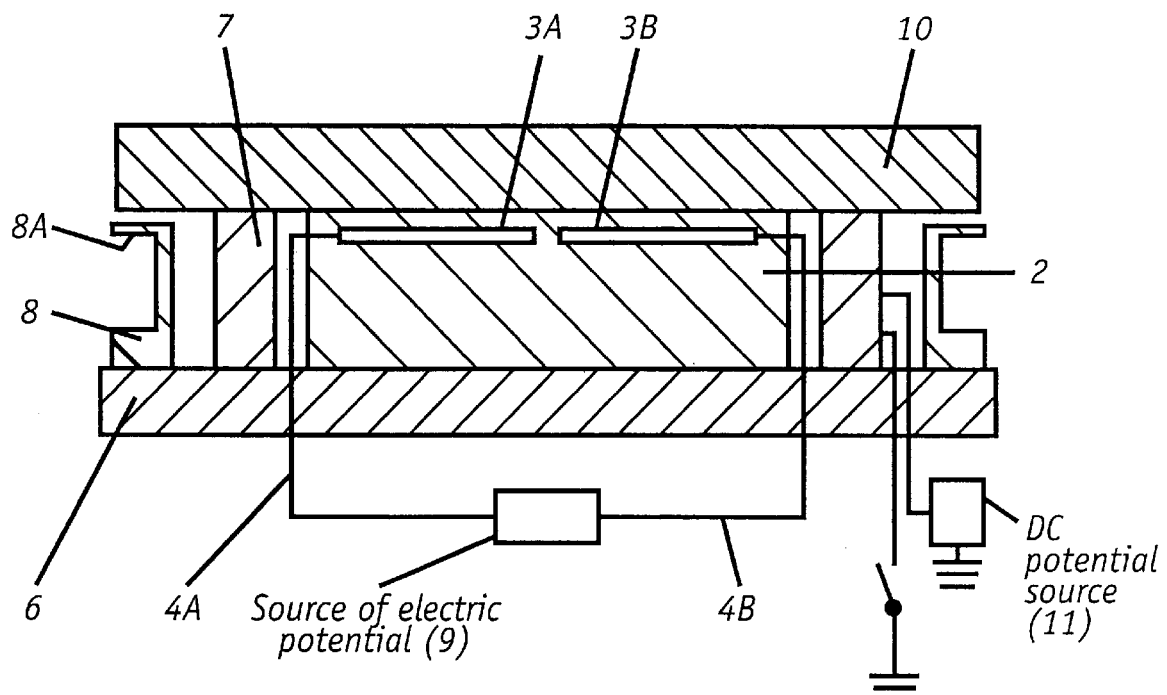
FIG. 1 is a cross sectional view of an electrostatic chuck.

FIG. 1 is a cross-sectional view of an electrostatically screened, voltage controlled chuck. By "voltage controlled" is meant that the overall voltage (i.e., dc offset) of the substrate can be controlled and preferably the voltage is maintained at zero volts (i.e., ground potential). The electrostatic chuck comprises an insulator block 2 having flat plate electrodes 3A and 3B that are embedded therein and that are separated by a gap in between them. The electrodes are positioned preferably just below the surface of the insulator block 2 that comprises a ceramic material such as glass, e.g., quartz. The insulator block is shaped and sized to support a substrate 10 (e.g., reticle or mask) thereon and is attached to a support base 6 which is typically metal, e.g., copper. The shape and sized of the insulator varies according to the dimensions of the substrate. The electrodes 3A and 3B are connected through wires 4A and 4B, respectively, to the source of electrical potential 9.

In a preferred embodiment, when designing the electrostatic chuck to hold a wafer, a voltage potential of 1200 volts dc is applied between the two electrodes. This voltage can be entered about a nominal null voltage (0±600 V) or it can be defined as a differential of 1200 volts, about a dc offset voltage.

The electrostatic chuck also includes a shield or guard ring 7 which is positioned around the outer perimeter of the insulator block 2. The shield ring also rests on support base 6. In order to create upper surfaces on the insulator block 2 and shield ring 7 that are planer and have the same height and therefore be flush with the lower surface of substrate 10, in assembling the electrostatic chuck, the shield ring and the insulator block are both attached to the support base before the final polish step where the upper surface of both are polished together. The shield ring can be made of any suitable electrically conductive material. Copper and other materials whose oxides are electrically conductive are preferred. In a preferred embodiment, the shield ring 7 is grounded as shown. In this fashion substrate 10 is also electrically grounded and since the electrostatic chuck is typically positioned within a grounded vacuum chamber structure, there should be no potential gradient between the substrate and the vacuum chamber that would generate electric fields on the substrate. However, the shield ring can also be connected to a dc potential source 11. In the event that the substrate is located near a vacuum chamber structure which is not grounded, then this dc potential source 11 can be activated to control the potential on the substrate and thereby prevent any potential gradient between the substrate and structure.

The distance of the gap between shield ring 7 and insulator block 2 of the electrostatic chuck can be designed based on Paschen's Law which can be employed to predict the breakdown voltage of a gas between two plates (e.g., charged electrodes) at subatmospheric pressures. The breakdown voltage depends on the gas pressure and the distance between the plates. Specifically, for the electrostatic chuck the distance is chosen so that, for a particular set of operational parameters, e.g., pressure and electrode voltages, there is no arcing between the shield ring 7 and the insulator block 2. For pressures on the order 50 mTorr, the gap distance should be less than about 5 mm and preferably between about 1 mm to 2 mm to prevent electrical breakdown at a potential of up to about 4 kV.

It is expected that primary electrostatic shield 7 will provide essentially complete electrostatic screening. However, in a preferred embodiment, the electrostatic chuck further includes a secondary shield or guard ring 8 as shown in FIG. 1 to provide additional electrostatic shielding. The secondary shield includes an extension or arm 8A that runs parallel to the lower surface of the substrate. This arm further prevents stray electric fields from wrapping around and into the upper surface of the substrate 10. As shown in FIG. 1, in the preferred embodiment, the height of secondary guard ring 8 is less than that of the electrostatic shield 7 so that upper surface of the arm 8A does not touch substrate 10. These heights may be the same if desired so that the substrate 10 is supported by the upper surfaces of the insulator block 2, electrostatic shield 7, and the arm of the secondary guard ring. The configuration shown in FIG. 1 is preferred in part because it avoids the undesired situation where the height of the arm 8A is inadvertently manufactured to be higher than that of electrostatic shield 7 which would adversely affect the gripping of the substrate. The secondary electrostatic shield like the primary electrostatic shield is also made of any suitable electrically conducting material.

As is apparent, with the improved electrostatically screened, voltage-controlled electrostatic chuck, the primary electrostatic shield ring provides for simultaneous electric-field screening and voltage control of the lithographic component, e.g., wafer. In addition, the secondary electrostatic shield 8 provides additional assurance that the stray electric field from the chuck is zero. Finally, the spacing between the insulator block and the primary shield ring provides for arc-free operation of the chuck in the subatmospheric pressure range.

Figure 2:
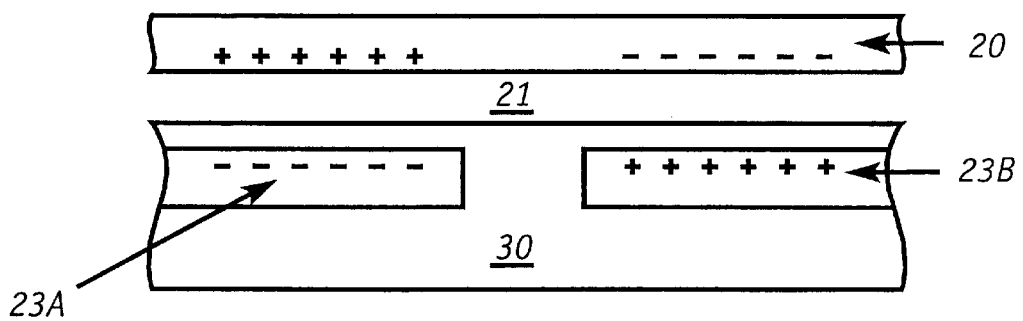
FIG. 2 is a partial cross sectional view of a substrate/chuck interface.

In operation, after a substrate (e.g., wafer) has been placed on the insulator block, the source of electric potential is activated. As shown in FIG. 2, which illustrates the substrate/chuck interface, the voltage potential difference establishes a charge distribution through the dielectric material of the substrate 20. Positive charge on the substrate accumulates to align with the negatively biased electrode 23A and negative charge aligns with the positively biased electrode 23B. Both electrodes are embedded in insulator material 30 of the chuck. Gap 21 is the top glass layer separating electrodes 3A, 3B from the substrate 10. In operation, the substrate 20 is presented to the chuck, the charges in the substrate redistribute on the substrate underside, with zero lateral electric field on the substrate top surface even while gripping.

Electric fields issuing from directly underneath the substrate are effectively terminated inside the substrate, so essentially no electric field is produced at the upper surface of the substrate. However, without the primary electrostatic shield ring there would be large fringing fields issuing from the sides of the electrostatic chuck that would effectively wrap around the perimeter of the substrate thereby producing strong fringing electric fields above the substrate upper surface. Such fields would lead to undesirable electrostatic deposition of particles onto the wafer or mask surface. Furthermore, without the voltage control provided by the primary electrostatic shield ring 7, capacitance-induced voltages can develop on the wafer, for example, if the capacitances between the electrodes and the substrate differ from each other by about 1% or more, small but unacceptable voltages can develop on the upper substrate surface to cause further undesirable electrostatic deposition. Further, if the voltages on electrodes 3A and 3B are not carefully balanced, with respect to 0V, then there can be produced an offset voltage on the substrate. Of course, an offset voltage may be desirable for some applications, but this voltage must be controllable.

Figure 4:
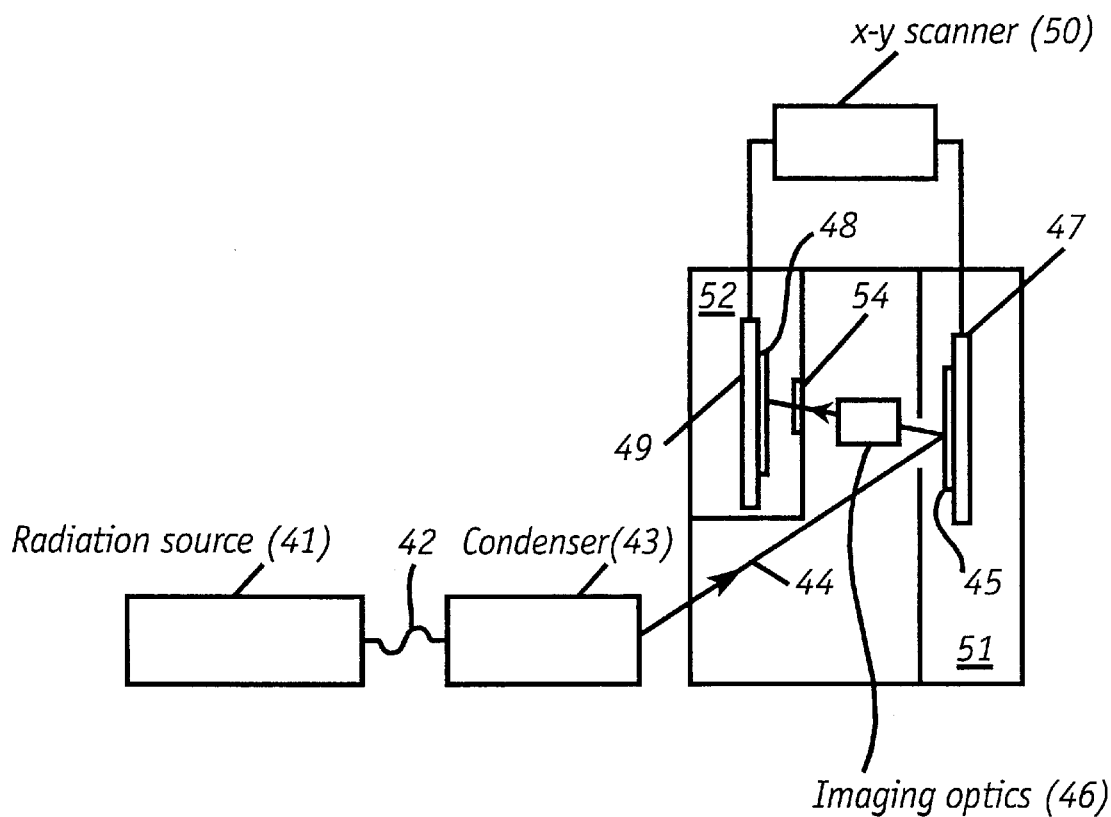
FIG. 4 is schematic diagram of a photolithography apparatus.

The electrostatic chuck of the present invention is particularly suited for photolithography systems where the electrostatic chuck operates in a vacuum chamber. FIG. 4 schematically depicts an apparatus for EUV lithography that comprises a radiation source 41, such as a synchrotron or a laser plasma source, that emits EUV radiation 42 into condenser 43 which in turn emits beam 44 that illuminates a portion of reticle or mask 45. The emerging patterned beam is introduced into the imaging optics 46 which projects an image of mask 45, shown mounted on mask stage 47, onto wafer 48 which is mounted on stage 49. Element 50, an x-y scanner, scans mask 45 and wafer 48 in such direction and at such relative speed as to accommodate the desired mask-to-image reduction.

The wafer is preferably housed in a wafer chamber that is separated from the other elements of the photolithography system located upstream as illustrated in FIG. 4. The mask 45 is housed in chamber or zone 51 which is typically maintained at sub-atmospheric pressure preferably between 1 mTorr to 100 mTorr. Similarly, wafer 48 is housed in chamber or zone 52 which is preferably maintained at a pressure below about 100 mTorr. Chamber 52 includes a window 54 that is made of a suitable material that transmits EUV. The other elements can be housed in one or more chambers which are preferably maintained in vacuum to minimize attenuation of the x-rays. EUV radiation projected from the reticle and translated by a camera travels through an aperture in the wafer chamber. The individual elements that form the EUV lithography device as shown in FIG. 4 can comprise conventional optical devices, e.g., condensers, cameras, and lens, for projection EUV lithography. Preferably the EUVL device employs a condenser that collects soft x-rays for illuminating a ringfield camera.

As illustrated in FIG. 4, the upper surface of mask 45 is facing the upper surface of the wafer 52. In one embodiment, the reticle is inverted so that gravity pulls the wafer from the electrostatic chuck. A higher electrostatic charge will be needed to account for the gravitational force.

Figure 3:
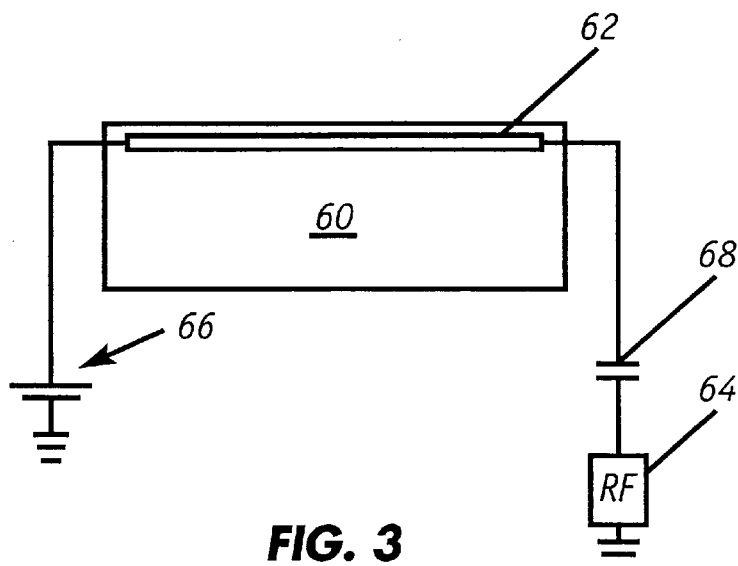
FIG. 3 is a partial cross sectional view of an electrostatic chuck illustrating the monopolar design.

The electrostatic chuck described above is of a bipolar design. It is understood that the electrostatic chuck can be a monopolar design as illustrated in FIG. 3 for instance. By "monopolar" is meant that it is biased at a single polarity, e.g., positive, during use. As is apparent, the monopolar design can be employed if the substrate is designed to be positive or negative charged. With the monopolar configuration, an electrode 62 is embedded in insulator block 60. The overall dimensions of electrode 62 is preferably equal to that of the two electrodes 3A and 3B of the bipolar configuration of FIG. 1. The chuck is energized by RF supply 64, typically through a capacitor circuit 68 to isolate the dc component of the chuck from the RF component of RF supply 64. By activating power supply 66 to bias the chuck positively with respect to a negatively charged substrate, for instance, (not shown) a capacitor circuit is created with the wafer and chuck acting as the two capacitor plates. In between these two plates, electrostatic forces is created to securely clamp the wafer onto the chuck. The remaining components of the electrostatic chuck is the same for the bipolar design described above. Monopolar electrostatic devices are known in the art and for described, for example in U.S. Pat. 5,221,403, 5,835,333 and 5,835,334 which are incorporated herein.

While the configuration of the electrodes is not critical, a preferred embodiment comprises two planar annular electrodes, one positioned concentrically within the other, with each having same surface areas. The insulator block is preferably made of any suitable ceramic material preferably with a low expansion coefficient. A preferred material is glassy ceramic that is commercially available such as ZERODUR from Schott Jenaer Glas, GmbH, Mainz, Germany.

One method of embedding the electrodes in the insulator block is to deposit two thin layers of a metal conductor such as aluminum onto the surface of a block ceramic material, e.g., ZERODUR. The metal layers serve as the electrodes. Thereafter, a layer of ceramic material, e.g, alumina, is coated over the electrodes.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An electrostatic chuck for holding a substrate that comprises:
    an insulator block having an outer perimeter and a planar surface adapted to support the substrate and comprising at least one electrode therein;
    a source of voltage that is connected to the at least one electrode;
    a support base to which the insulator block is attached; and
    a primary electrostatic shield ring that is made of an electrically conductive material and which is positioned around the outer perimeter of the insulator block.

2. The electrostatic chuck of claim 1 wherein the primary electrostatic shield ring defines a planar surface that is flush with the planar surface of the insulator block.

3. The electrostatic chuck of claim 1 wherein the at least one electrode comprises a pair of electrodes that are embedded in the insulator block.

4. The electrostatic chuck of claim 1 further comprising means for controlling the potential on a surface of the substrate.

5. The electrostatic chuck of claim 1 wherein the primary electrostatic shielding ring is grounded.

6. The electrostatic chuck of claim 1 wherein the primary electrostatic shield ring has an inner surface that is separated from the outer perimeter of the insulator block by a distance of 1 mm to 2 mm.

7. The electrostatic chuck of claim 1 wherein the primary electrostatic shield ring has an inner surface that is separated from the outer perimeter of the insulator block by a distance of less than about 5 mm.

8. The electrostatic chuck of claim 1 further comprising a secondary electrostatic shield ring positioned around and spaced apart from an outer surface of the primary electrostatic shield ring.

9. The electrostatic chuck of claim 1 wherein the insulator block is made of glass.

10. The electrostatic chuck of claim 3 further comprising means for controlling the potential on a surface of the substrate.

11. The electrostatic chuck of claim 3 wherein the primary electrostatic shielding ring is grounded.

12. The electrostatic chuck of claim 3 further comprising a secondary electrostatic shield ring positioned around and spaced apart from an outer surface of the primary electrostatic shield ring.

13. A method of holding a substrate having front and back surfaces in a chamber having a sub-atmospheric pressure that comprises the steps of: providing an electrostatic chuck comprising:

(a) an insulator block having an outer perimeter and a planar surface adapted to support the substrate and comprising at least one electrode therein;

(b) a source of voltage that is connected to the at least one electrode;

(c) a support base to which the insulator block is attached; and (d) a primary electrostatic shield ring that is positioned around the outer perimeter of the insulator block;

placing the substrate on the planar surface of the insulator block wherein the back surface of the substrate is resting on the planar surface;

applying a voltage to the at least one electrode to electrically bias the insulator block to provide an electrostatic clamping voltage, whereby the magnitude of any electric field adjacent the front surface of the substrate is minimized.

14. The method of claim 13 further comprising the step of controlling the potential on a surface of the substrate.

15. The method of claim 13 wherein the primary electrostatic shield ring defines a planar surface that is flush with the planar surface of the insulator block.

16. The method of claim 13 wherein the at least one electrodes comprises a pair of electrodes that are embedded in the insulator block.

17. The method of claim 13 further comprising grounding the primary electrostatic shielding ring.

18. The method of claim 13 wherein the primary electrostatic shield ring has an inner surface that is separated from the outer perimeter of the insulator block by a distance of 1 mm to 2 mm.

19. The method of claim 13 wherein the primary electrostatic shield ring has an inner surface that is separated from the outer perimeter of the insulator block by a distance of less about 5 mm.

20. The method of claim 13 wherein the electrostatic chuck comprises a secondary electrostatic shield ring positioned around and spaced apart from an outer surface of the primary electrostatic shield ring.

21. The method of claim 13 wherein the insulator block is made of glass.

22. The method of claim 16 comprising the step of controlling the potential on a surface of the substrate.

23. The method of claim 16 further comprising grounding the primary electrostatic shielding ring.

24. The method of claim 16 wherein the electrostatic chuck comprises a secondary electrostatic shield ring positioned around and spaced apart from an outer surface of the primary electrostatic shield ring.

* * * * *